(12) United States Patent
Ismail (10) Patent No.: US 6,495,388 B1
(45) Date of Patent: Dec. 17, 2002

(54) SURFACE MICRO-MACHINED SENSOR WITH PEDESTAL

(75) Inventor: M. Salleh Ismail, Moorpark, CA (US)

(73) Assignee: Kavlico Corporation, Moorpark, CA (US)

(*) Notice: Subject to any disclaimer, the term of this patent is extended or adjusted under 35 U.S.C. 154(b) by 0 days.

(21) Appl. No.: 09/538,127

(22) Filed: Mar. 29, 2000

Related U.S. Application Data (62) Division of application No. 08/896,793, filed on Jul. 18, 1997, now Pat. No. 6,211,558.

(51) Int. Cl.$^7$ ............................................... H01L 21/00
(52) U.S. Cl. ........................... 438/53; 438/50; 438/456; 257/252; 257/254
(58) Field of Search ............................. 438/53, 50, 51, 438/456; 257/419, 252, 254

(56) References Cited

U.S. PATENT DOCUMENTS

| | | | |
|---|---|---|---|
| 4,121,334 A | 10/1978 | Wallis | 29/589 |
| 4,188,258 A | * 2/1980 | Mounteer et al. | 438/50 |
| 4,327,350 A | * 4/1982 | Erichsen | 338/4 |
| 4,415,948 A | 11/1983 | Grantham et al. | 257/419 |
| 4,498,070 A | * 2/1985 | Lirman | 338/42 |
| 4,812,888 A | 3/1989 | Blackburn | 357/26 |
| 4,861,420 A | 8/1989 | Knutti et al. | 156/633 |
| 4,975,390 A | 12/1990 | Fujii et al. | 437/228 |

(List continued on next page.)

FOREIGN PATENT DOCUMENTS

| | | | |
|---|---|---|---|
| JP | 61-220600 | * 9/1986 | |
| JP | 04-267565 | * 9/1992 | |
| WO | WO 085005737 | 12/1985 | 257/419 |

OTHER PUBLICATIONS

Timoshenko et al., "Theory of Plates and Shells", McGraw–Hill Book Company, Inc., 1959, Chapter 3, Sections 15, 16 and 17 (15 pages).

Bengtsson, "Semiconductor Wafer Bonding: A Review of Interfacial Properties and Applications", Journal of Electronic Materials, vol. 21, No. 8, Aug. 1992, pp. 841–862.

*Primary Examiner*—Carl Whitehead, Jr.
*Assistant Examiner*—Christy Novacek
(74) *Attorney, Agent, or Firm*—Skjerven Morrill LLP; Norman R. Klivans

(57) ABSTRACT

A surface micro-machined sensor uses a pedestal in a cavity to support a flexible structure and reduce the span of the flexible structure. The reduced span per sense area allows larger sensor areas without permitting forces to permanently deform the flexible structure or cause the structure to touch an opposite wall of the cavity. The flexible structure bonded to the pedestal and an elevated region surrounding the pedestal defines a cavity between the flexible membrane and a lower plane region. Active regions can be formed in the lower plane region for capacitors or transistors. A pedestal can be of various shapes including a circular, ovoid, rectangular or polygonal shape. The lower plane region can be of various shapes including a ring or donut shape, ovoid, rectangular or polygonal shape with an inner dimension corresponding to the outer dimension of the pedestal. The elevated region can be of various shapes with an inner dimension corresponding to the outer dimension of the lower plane region. Alternative embodiments of the invention include cavities containing multiple pedestals which may be concentric. Additionally, a central pedestal may be hollow to increase sensor volume. The device can be a capacitive sensor with plates in the active region and the flexible structure. The device can be a piezoresistive sensor with the flexible structure containing piezoresistive elements. The device can also be a transistor with source, drain, and channel in the active regions of the substrate and the flexible structure containing a gate.

8 Claims, 10 Drawing Sheets

U.S. PATENT DOCUMENTS

| | | | |
|---|---|---|---|
| 5,165,289 A | 11/1992 | Tilmans | 73/862.59 |
| 5,233,874 A | 8/1993 | Putty et al. | 73/517 |
| RE34,893 E | 4/1995 | Fujii et al. | 257/254 |
| 5,408,112 A | 4/1995 | Tai et al. | 257/254 |
| 5,447,076 A * | 9/1995 | Ziegler | 73/862.626 |
| 5,479,827 A * | 1/1996 | Kimura et al. | 361/283.4 |
| 5,578,843 A | 11/1996 | Garabedian et al. | 257/254 |
| 5,629,538 A | 5/1997 | Lipphardt et al. | 257/254 |
| 5,821,596 A * | 10/1998 | Miu et al. | 257/419 |
| 5,912,499 A | 6/1999 | Diem et al. | 257/419 |

* cited by examiner

SURFACE MICRO-MACHINED SENSOR WITH PEDESTAL

This Application is a divisional of application Ser. No. 08/896,793, filed Jul. 18, 1997, (Now U.S. Pat. No. 6,211, 558) entitled "Surface Micro-Machined Sensor With Pedestal" of M. Salleh Ismail and Raffi M. Garabedian, which is owned by the assignee of this application and is hereby incorporated by reference in its entirety.

BACKGROUND

1. Field of the Invention

This invention relates generally to semiconductor devices including flexible structures and, more particularly, to semiconductor sensors including capacitors, piezoresistors, and transistors with flexible structures partly supported by a pedestal.

2. Description of Related Art

Known micro-machined sensors are semiconductor devices with flexible structures that move or deform to change properties such as the capacitance, resistance, or transconductance of the devices. The changed property can be measured to determine the magnitude of the force that deformed the flexible structure. For example, a typical surface micro-machined capacitive sensor has a flexible plate (usually circular), suspended over a fixed substrate containing a conductive region. In this arrangement, the plate and the substrate form the two electrodes of a capacitor. A force on the flexible plate deforms or moves the flexible plate and changes the capacitance between the electrodes. A wide variety of capacitive sensors including pressure sensors and accelerometers use this principle. An important part of designing a good capacitive sensor is to maximize the change in capacitance with applied force because the change in capacitance is often the primary factor determining detector resolution.

Other types of semiconductor sensors include piezoresistive and transconductive devices. Semiconductor piezoresistive devices typically include a piezoresistive element formed in flexible diaphragm suspended over a cavity in a substrate. Deformation of the flexible diaphragm caused by an applied force changes the resistance of the piezoresistive element and allows measurement of the applied force. Moving gate field effect transistors have a flexible diaphragm that forms the gate of the transistor and is suspended over a cavity in a substrate containing source, drain, and channel regions of the transistor. An applied force deforms the gate and changes the threshold voltage of the transistor.

Surface micro-machining is a fabrication technique that allows the production of planar mechanical and electrical elements on a semiconductor wafer. The mechanical elements such as flexible diaphragms are most commonly formed using a polysilicon layer deposited on a sacrificial layer that is subsequently removed to provide gaps or cavities between the polysilicon layer and the underlying layer. A newer form of surface micro-machining employs a monocrystalline layer that is fusion bonded to a structured substrate. An important advantage of the newer form of surface micro-machining is that monocrystalline silicon possesses superior mechanical properties compared to polysilicon. In both cases, the need for subsequent photolithography and processing using standard semiconductor fabrication techniques limits the thickness of the mechanical layer, either the polysilicon layer or the monocrystalline silicon layer, to a few microns, typically less than 10 microns.

The combined requirements of maximizing sensor capacitance and limiting the thickness of the flexible structures lead to significant design trade-offs. For example, in a capacitive pressure sensor with a particular pressure range, the plate thickness limits the maximum diameter of a flexible plate and the minimum allowable nominal gap between the plates. Specifically, the thickness and span of the flexible plate must be such that the maximum measurable pressure and electrostatic attractive forces in the sensor do not cause the flexible plate to contact the fixed plate. These constraints limit the maximum attainable capacitance for the sensor. Equation 1 shows the relationship between the maximum pressure Pmax and the maximum plate deflection Wmax (at the center of a circular plate), $$W_{max} = P_{max} R^4 / 64\, D \qquad \text{Equation 1}$$

In Equation 1, D is the flexural modulus of the flexible plate (for a given thickness and material), and R is the radius of the circular plate. There is no design flexibility in capacitive area as radius R is fully specified for a given Pmax, D, and Wmax. As an example, a typical 600 kPaA (kilopascals absolute) sensor has a nominal capacitance of 0.5 pF (picofarads). In order to increase the maximum capacitance, the designer must have control over an additional design parameter.

Hence, a structure is needed that can be manufactured by a process that provides design control over the area of the capacitive plates irrespective of pressure range and plate thickness.

SUMMARY OF THE INVENTION

A semiconductor device includes a semiconductor substrate, a pedestal formed on the surface of the substrate, a lower plane region on the surface of the substrate surrounding the pedestal, an elevated region formed on the surface of the substrate surrounding the lower plane region, a flexible membrane bonded to the top surface of the pedestal and the elevated region, and an active region formed in the lower plane region underlying the flexible membrane. The flexible membrane can be any suitable material that is flexible under the forces to be measured. Such materials include but are not limited to monocrystalline silicon, polycrystalline silicon, silicon dioxide, or silicon nitride. The pedestal reduces the span of the flexible membrane and thus allows a larger area for the membrane without exceeding the maximum permitted deflection of the flexible membrane. Multiple pedestals may be added to further increase membrane area.

One embodiment of the invention is a semiconductor device that is a capacitive sensor having a capacitance value dependent upon the position of the flexible membrane relative to the active region that is conductive and acts as a capacitor plate. The active region is formed in or on a lower plane region beneath the flexible membrane and surrounding a pedestal that extends from the lower plane region to the flexible membrane. Alternative embodiments of the invention have the pedestals with different cross-sectional shapes including circular, ovoid, and rectangular. The lower plane region extends from an outer perimeter of the pedestal to an inner perimeter of the elevated region.

Another embodiment of the invention is a semiconductor device that is piezoresistive sensor having a resistive value dependent upon the deformation of a flexible membrane that is a supported by one or more pedestals.

Yet another embodiment of the invention is a semiconductor device that includes a moving gate transistor sensor

BRIEF DESCRIPTION OF THE DRAWINGS

Use of the same reference symbols in different figures indicates similar or identical items.

DETAILED DESCRIPTION

In accordance with an embodiment of the invention, semiconductor devices or sensors having flexible structures are formed using processes that closely conform to standard MOS processes and thereby permit integration of on-chip electronics including conventional integrated circuit elements. One embodiment of the invention includes a MOving Plate CAPacitor (MOPCAP). In a MOPCAP, a flexible membrane is a "top plate" of the capacitor, and a "bottom plate" of the capacitor is an active region under the flexible membrane. The active region may be, for example, a diffused region in a semiconductor substrate underlying the flexible membrane or a deposited conductor such as a metal, polysilicon, or silicide region on an underlying substrate. Movement of the membrane relative to the bottom plate of the capacitor measurably changes the capacitance of the device. Another embodiment contains a MOGFET (MOving Gate Field Effect Transistor). A MOGFET is constructed with a flexible (moving) membrane as the gate of the MOGFET and source, drain, and channel regions being active regions under the flexible membrane. The movement of the membrane (the gate) relative to the source, drain, and channel changes the threshold voltage of the MOGFET. U.S. patent Ser. No. 5,578,843 describes architectures and manufacturing processes for specific MOPCAP and MOGFET sensors and is incorporated by reference herein in its entirety. Yet another embodiment of the invention includes a piezoresistive sensor. A piezoresistive sensor is constructed with a flexible membrane having a piezoresistive element formed therein or thereon. Movement of the flexible membrane deforms the piezoresistive element and varies the resistivity of the piezoresistive element according to the position of the flexible membrane. It is generally desirable to increase the size of the polysilicon surface micromachined piezoresistive sensor in order to improve the accuracy of the piezoresistor placement which is a key factor in sensor design, sensitivity, and matching for temperature compensation.

A variety of processes can shape semiconductor surfaces or form cavities for sensors in accordance with embodiments of the invention. In one "sacrificial" process, a polysilicon, nitride, metal, or other film is deposited over a sacrificial layer before chemical etching removes the sacrificial layer from under the film to form a cavity. Another sacrificial process deposits a film over a sacrificial layer that is made of a material that is absorbed by a surrounding material in a subsequent process. U.S. patent Ser. No. 4,812,888 (incorporated by reference herein in its entirety) describes forming a movable gate using a sacrificial layer process. Surfaces can also be shaped by local oxidation (LOCOS) such as described in U.S. patent Ser. No. 5,578,843.

In one embodiment of the invention, a sensor is formed with a pedestal in a cavity to support a flexible membrane and reduce the span of the flexible membrane. In an exemplary process, local oxidation (LOCOS) followed by removal of oxide forms a pedestal on a first semiconductor substrate, a depressed area surrounding the pedestal, and an elevated region surrounding the depressed area. (LOCOS and oxide removal may be repeated to form additional levels of the surface structure.) Standard MOS devices and active regions can be fabricated in the first substrate in the depressed area surrounding the pedestal. A fusion bonding process bonds a second substrate to the pedestal and the elevated region on the surface of the first substrate and encloses the active regions within a cavity bounded by second substrate, the depressed area, and the sides of the pedestal and the elevated region. The second substrate is then shaped to form a flexible structure overlying the cavity.

Use of a pedestal in the cavity increases design flexibility of the flexible structure so that the area of a membrane is not entirely constrained by the membrane thickness and the desired pressure range of the sensor. For example, for a doughnut or ring shaped cavity structure, maximum membrane deflection Wmax which occurs at the maximum pressure Pmax is a function of maximum pressure Pmax, flexural modulus D of the flexible structure, an inner radius Rid of the cavity, and an outer radius Rod of the cavity as illustrated in Equation 2.

$$W\text{max} = W\text{max}(Rod, Rid, P\text{max}, D) \quad \text{Equation 2}$$

The actual relation can be derived from a combination of the classical plate equations such as those given in Timoshenko, "Theory of Plates and Shells," 1959, chapter 3, sections 15, 16, and 17. If the difference between outer radius Rod and inner radius Rid is held constant, increasing radii Rid and Rod increases the plate area and capacitance without increasing the maximum deflection Wmax. (For increasing radii Rid and Rod, Equation 2 if calculated exactly for a circular pedestal and annular cavity permits the difference between Rod and Rid to increase slightly without increasing the maximum deflection Wmax.) For example, a prior art circular flexible plate capacitor with a 5-$\mu$m thick silicon plate and a maximum pressure Pmax of 600 kPaA and a maximum deflection of 0.25 $\mu$m has a maximum plate radius of 72 $\mu$m which results in a plate area of 16,286 $\mu m^2$. A ring shaped flexible plate capacitor using the same membrane material, an inner radius Rid of 20 $\mu$m, and an outer radius Rod of about 130 $\mu$m provides a plate area of 51,836 $\mu m^2$ and still meets the requirements of a maximum deflection of 0.25 $\mu$m at a pressure Pmax of 600 kPaA. This results in a 3-fold increase in nominal capacitor area and capacitance. The plate area may be further increased by increasing inner radius Rid and adjusting outer radius Rod according to desired maximum pressure Pmax. Use of a central pedestal to achieve larger membrane area for a given plate thickness and pressure range can be applied to any shaped diaphragm and sensor cavity including, but not restricted to ovoid, rectangular, or polygonal shapes and to MOGFET or piezoresistive sensor diaphragms to increase channel width or improve piezoresistors placement.

Figure 1A:
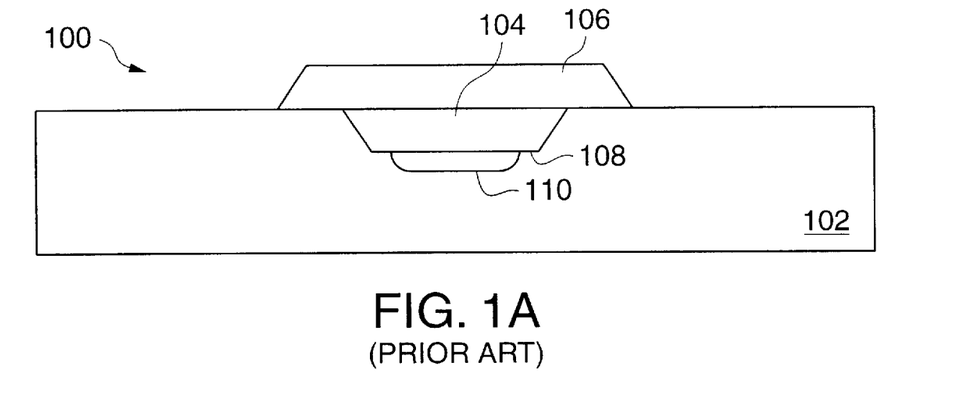
FIGS. 1A and 1B are respectively a cross-sectional side view and a plan view of a prior art circular capacitive sensor.
Figure 1B:
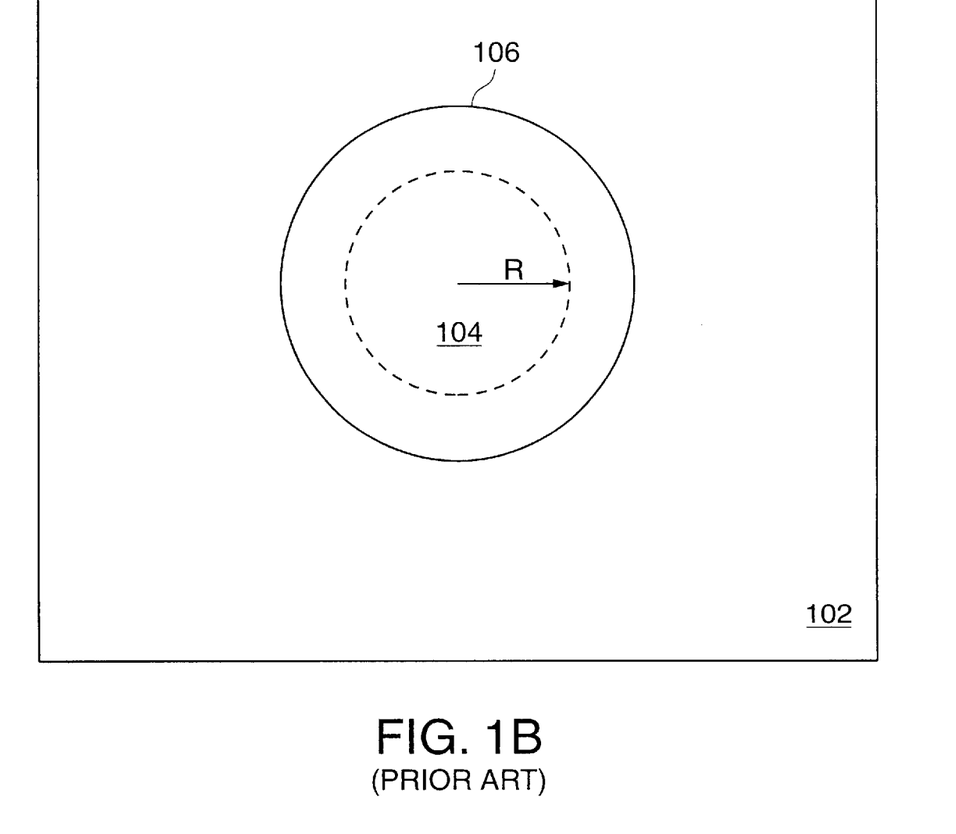

FIGS. 1A and 1B respectively show cross-sectional and plan views of a conventional circular diaphragm capacitive sensor 100 (MOPCAP) as known in the art. Sensor 100 includes a substrate 102, a sense cavity 104 defined by a diaphragm 106 and a surface 108 of a circular depression in substrate 102. A bottom plate 110 is formed in surface 108 of substrate 102.

Figure 2A:
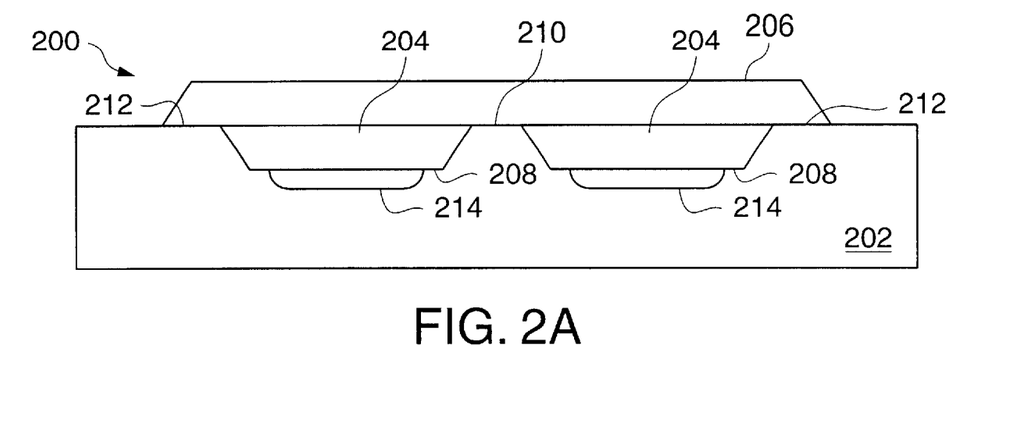
FIGS. 2A and 2B are respectively a cross-sectional side view and a plan view of a capacitive sensor in accordance with an embodiment of the invention.
Figure 2B:
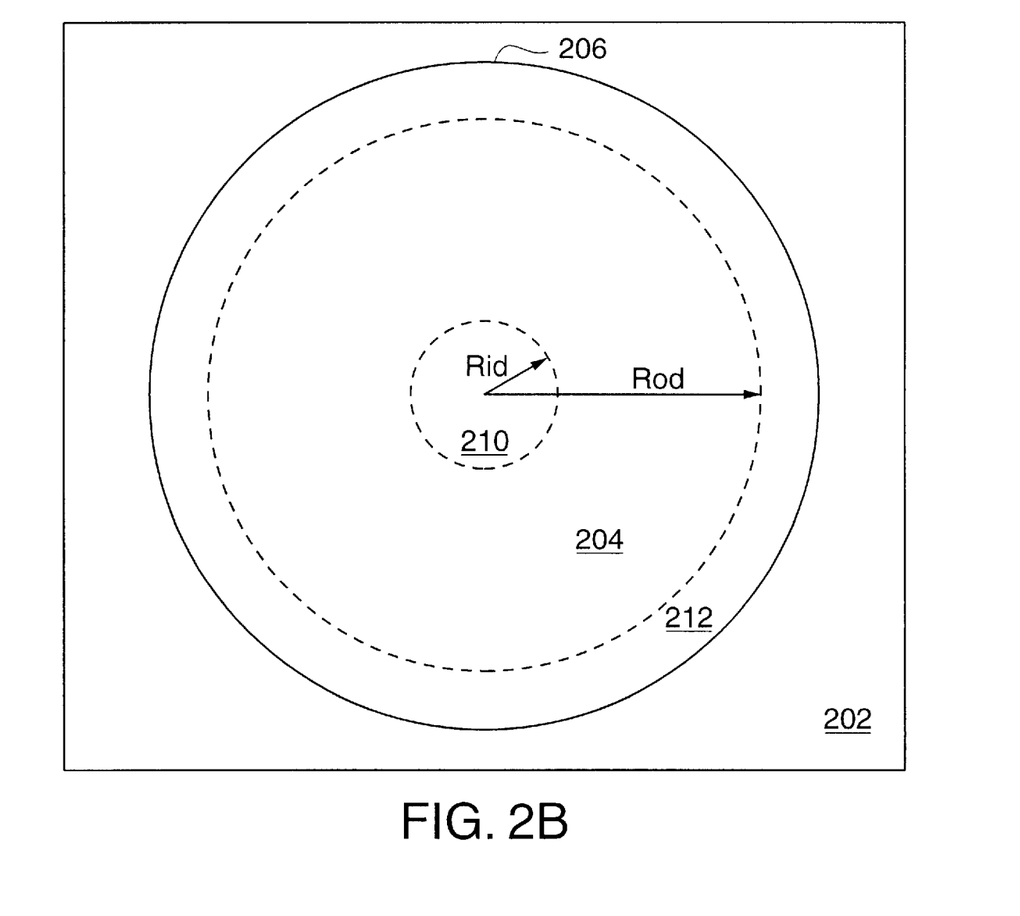

FIGS. 2A and 2B respectively show cross-sectional and plan views of a capacitive sensor 200 in accordance with an embodiment of the invention. Sensor 200 includes a substrate 202 and a diaphragm 206 that define a sense cavity 204 bounded by a diaphragm 206, a lower surface 208, and walls of a pedestal 210 and an elevated region 212. Diaphragm 206 forms a top plate of a MOPCAP in sensor 200. A bottom plate 214 is formed in surface 208. Bottom plate 214 is a region of high conductivity, sometimes referred to herein as a sense plate, and is connected to external circuitry that senses the electrical potential on bottom plate 214.

Figure 3:
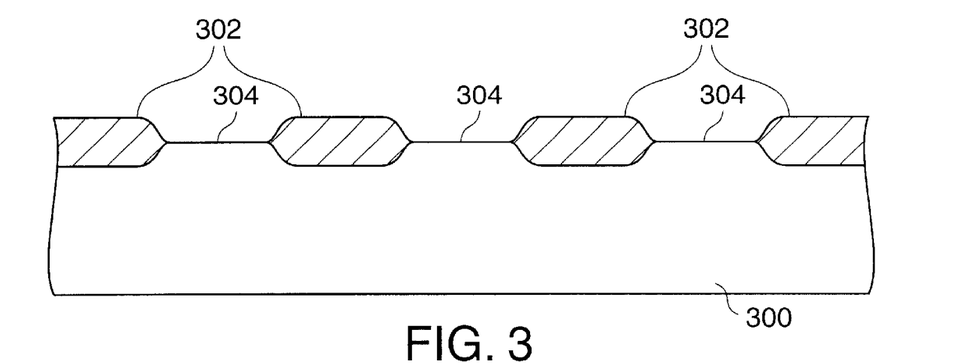
FIG. 3 shows the surface structure for cavity definition by silicon consumption during LOCOS oxidation.

FIGS. 3–9 illustrate a standard or near-standard MOS process for fabrication process of a MOPCAP in accordance with an embodiment of the invention. As can be appreciated, conforming to a standard and well developed process currently practiced in the industry affords great advantages in cost, process control, yield, and reliability. FIG. 3 shows a silicon substrate 300 after local oxidation (LOCOS) forms silicon dioxide regions 302 about 0.2 to 1.6 $\mu$m thick. The LOCOS process is a well known technique and is commonly the first step in many MOS processes for forming field oxide isolation regions. The LOCOS process forms field oxide isolation regions and shapes the surface of substrate 300. Using LOCOS to shape a surface is sometimes referred to in the art and herein as LOCOS micro-machining. LOCOS consumes a layer (about 45% of the oxide thickness or roughly 0.1 to 0.8 $\mu$m) into the surface of the substrate 300 in the process of forming oxide regions 302.

Figure 4:
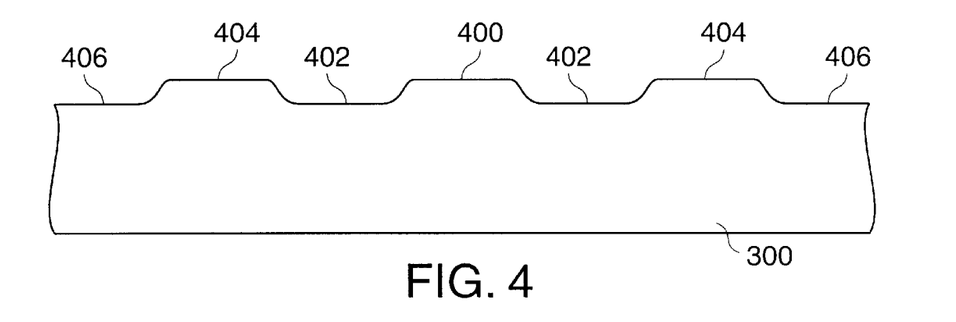
FIG. 4 shows the surface structure after removal of oxide shown in FIG. 3.

FIG. 4 shows the substrate 300 after removal of oxide regions 302. Removal of oxide regions 302 leaves a pedestal 400 surrounded by a lower plane region 402 (also referred to herein as device plane 402). In addition to pedestal 400 which corresponds to pedestal 210 (FIGS. 2A and 2B), lower plane region 402, which corresponds to surface 208 (FIGS. 2A and 2B), is surrounded by an elevated region 404 which corresponds to elevated region 212 (FIGS. 2A and 2B). It is noted that elevated region 404 is one continuous elevated region and could be, for example, a ring surrounding lower plane region 402, a rectangular structure or other shaped structures surrounding the lower plane region 402.

In one particular process, silicon substrate 300 is p type having a resistivity of about 27 ohm·cm. A typical LOCOS step includes: forming a thin pad oxide layer (not shown); depositing a silicon nitride layer on the pad oxide layer; forming a composite mask overlying and covering regions 304 (FIG. 3); etching away the exposed parts of the silicon nitride layer to expose the selected regions of the surface of silicon substrate 300 for oxidization; and oxidizing the exposed regions in a wet oxygen atmosphere at about 1050° C. for about 500 minutes to form silicon dioxide regions 302 that are about 1.6 $\mu$m thick. The silicon nitride that protects regions 304 from oxidation during the LOCOS step is stripped away using a standard process such as plasma etching or application of hot phosphoric acid before or after removal of oxide regions 302 and the pad oxide layer. Standard techniques such as wet etching remove oxide regions 302 and leave silicon substrate 300 as shown in FIG. 4 with the top of pedestal 400 and the top of elevated region 404 about 0.72 $\mu$m above lower plane region 402.

Figure 16:
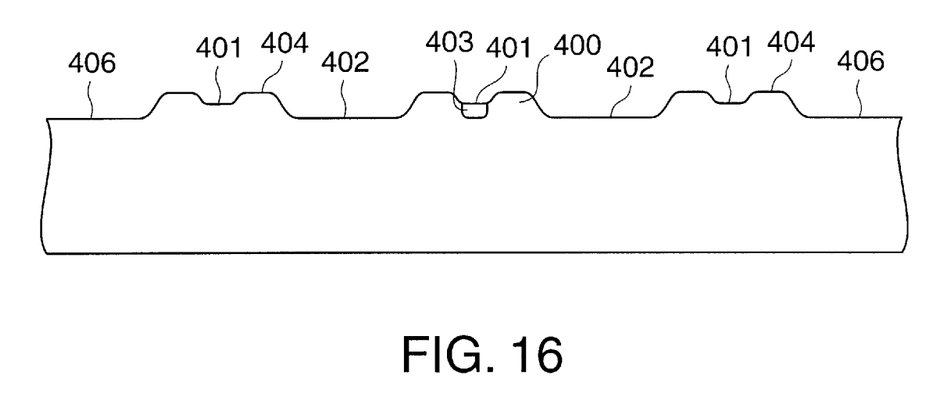
FIG. 16 is a cross-sectional side view of an alternative to FIG. 4.

In the process shown in FIGS. 3–9, the top surface of pedestal 400 and the top surface of elevated region 404 are flat after the initial LOCOS step. Alternatively, the first LOCOS step may form a depression 401 (FIG. 16) on top of pedestal 400 or elevated region 404. The contours of the depression may be further defined during a subsequent LOCOS step. The top of pedestal 400 and the top of elevated region 404 are typically less than 2 $\mu$m, but more than 500 Å above lower plane region 402 of substrate 300 and provide elevated bonding surfaces for fusion bonding of a second substrate as described below. MOS, bipolar, or other semiconductor devices can be formed in lower plane region 402 and in a region 406 surrounding elevated region 404.

Figure 5:
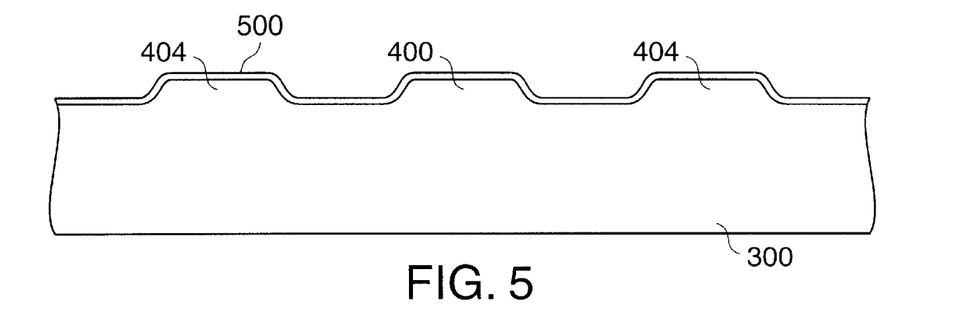
FIG. 5 shows a layer of oxide formed on the surface of the structure of FIG. 4.
Figure 6:
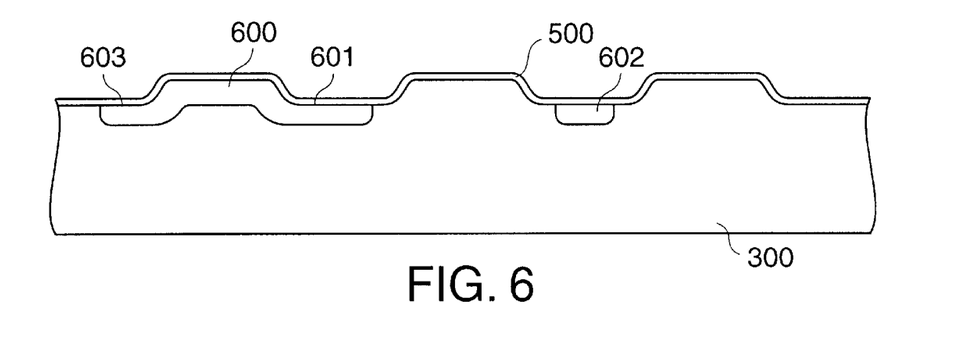
FIG. 6 indicates regions formed by ion implantation or diffusion to form capacitor plates or as interconnections to circuitry in other regions of the substrate.

FIG. 5 shows an oxide layer 500 formed on the surface of the substrate 300 after the formation of pedestal 400 and elevated region 404. Oxide layer 500 is a thin pre-implant oxide layer and precedes the formation of active regions in the substrate 300. After the formation of oxide layer 500, conventional masking and doping form an active region 600 shown in FIG. 6. Active region 600 includes a portion 601 in lower plane region 402 on one side of pedestal 400 and another portion 602 in lower plane region 402 on the other side of pedestal 400. Active region 600 continuously connects portions 601 and 602 around pedestal 400, and in plan view, active region 600 is one continuous region. A portion 603 of region 600 is in area 406, and provides a contact for an electrical connection to other parts of the semiconductor device formed in area 406. An active region 403 (FIG. 16) may be formed in depression 401 in a manner described above. A co-filed patent application entitled "FUSION-BOND ELECTRICAL FEED-THROUGH," U.S. patent application Ser. No. 08/897,124 describes alternative feed-through structures suitable for embodiments of the invention and is incorporated by reference herein in its entirety.

Figure 7:
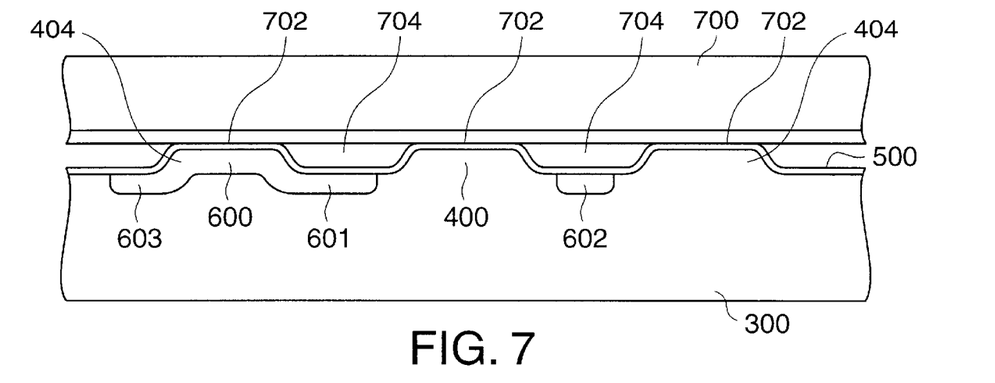
FIG. 7 shows the fusion bonding of a second wafer to the structure of FIG. 6.

FIG. 7 shows a second silicon substrate 700 which has been fusion bonded to bonding surfaces 702 on pedestal 400 and elevated region 404, thereby forming a sealed cavity 704. Fusion bonding is known in the art and bonds two optically smooth semiconductor surfaces with or without a thin layer of dielectric such as silicon dioxide or silicon nitride on the bonding surfaces. In the exemplary embodiment, oxide layer 500 provides a bond oxide on substrate 300 and protects substrate 300 while substrate 700 is shaped into a flexible structure. For fusion bonding, substrates 300 and 700 are chemically activated using a basic solution such as ammonium hydroxide and water and then thoroughly dried. The two smooth and clean substrates 300 and 700 are then brought into contact in an oxygen atmosphere to form a weak bond. The bonded pair of substrates 300 and 700 is then raised to a temperature of about 950° C. or higher for about 30 minutes. During fusion bonding, chemical reactions remove gases from cavity 704, leaving a vacuum. (In particular, oxygen reacts with the wall of the cavity 704 to form a thin layer of silicon dioxide.) Fusion bonding is known in the art and is described by Bengtsson, "Semiconductor Wafer Bonding: A Review of Interfacial Properties and Applications," 21(8) J. of Electronic Materials 841, 841–862 (1992) which is incorporated by reference herein in its entirety.

Figure 8:
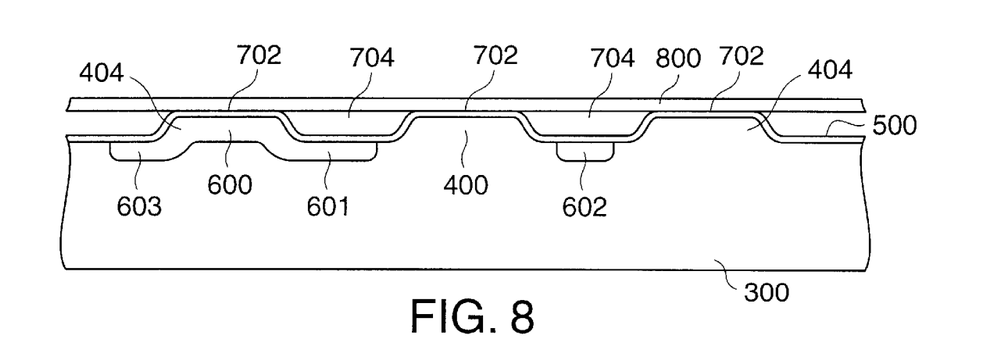
FIG. 8 shows the structure of FIG. 7 after thinning the second wafer to diaphragm thickness.
Figure 9:
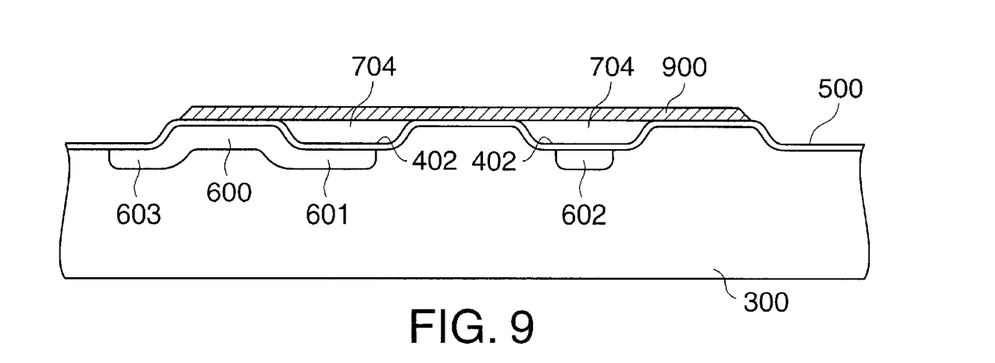
FIG. 9 shows the structure of FIG. 8 with further shaping of the second wafer.

Substrate 700 may be micro-machined, for example, by etching to an etch stop previously formed in substrate 700 or simply thinned by grinding, polishing, or etching to form a thinned wafer 800 as shown in FIG. 8. The thickness of thinned wafer 800 depends on the desired membrane structure to be formed but is typically between about 2 and 10 $\mu$m. Thinned wafer 800 is then trimmed to become a flexible membrane 900 as shown in FIG. 9. Movement of the flexible membrane 900 changes the height of cavity 704 and the capacitance between flexible membrane 900 and active region 600. Fusion bonding allows flexible membrane 900 to be a monocrystalline material such as monocrystalline silicon, germanium, or gallium-arsenide which have mechanical properties superior to deposited materials. In particular, the flexible membrane 900 has less mechanical hysteresis and less tendency to drift or permanently deform, and if made from the same material as substrate 300, is thermally matched to substrate 300. Flexible membrane 900 is implanted before or after thinning to make it electrically conducting for service as the top plate of the capacitance sensor.

As an alternative to the contour shown for substrate 300, pedestal 400 may be hollow so that fusion bonding flexible membrane 900 to substrate 300 forms a cavity including two compartments. Each compartment of the cavity may contain active regions under flexible membrane 900. The active regions in the two compartments may be connected together to form a single bottom plate for a capacitive sensor. The area of the capacitive sensor is thus increased without increasing the maximum span.

Figure 10:
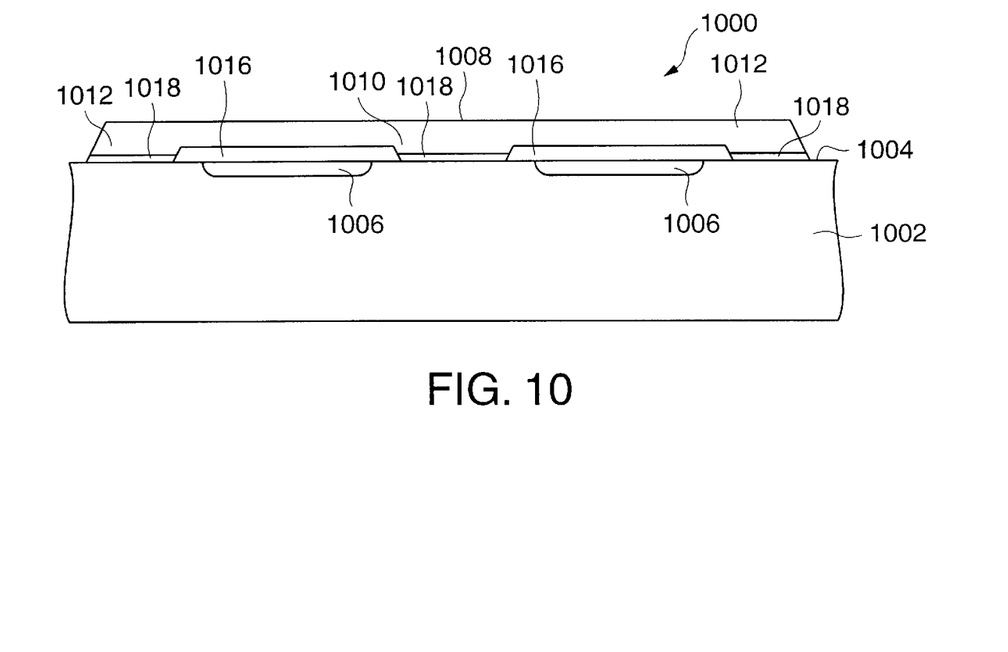
FIG. 10 is a cross-sectional side view of a capacitive sensor in accordance with another embodiment of the invention.

FIG. 10 shows a cross-sectional view of a sensor 1000 in accordance with another embodiment of the invention. Sensor 1000 is made up of a semiconductor substrate 1002 having a flat surface 1004. Surface 1004 has an active region 1006 formed therein. Active region 1006 can be formed as described above as high conductivity regions connected to external circuitry. A flexible membrane 1008 of monocrystalline or polycrystalline silicon, silicon nitride, silicon dioxide, or another thin film includes a pedestal 1010 and a surrounding elevated region 1012 bonded to bonding areas 1018 of flat surface 1004. (FIG. 10 shows the pedestal and elevated regions in an "upside-down" orientation.) Flexible membrane 1008 is bonded to substrate 1002 in such a way that a depression between pedestal 1010 and elevated region 1012 forms a cavity 1016. (Cavity 1016 is one continuous cavity.) As an alternative to surface 1004 being flat, surface 1004 may contain depressions that are aligned with depressions in membrane 1008 so that cavity 1016 extends up into membrane 1008 and down into substrate 1002.

In one embodiment of sensor 1000, flexible membrane 1008 and active region 1006 make up the plates of a capacitor wherein, as described above, the capacitance value depends upon the position of flexible membrane 1008 relative to the capacitor plate formed in active region 1006. Sensor 1000 can alternatively be a piezoresistive sensor with one or more piezoresistive elements being formed in or on membrane 1008 so that the resistivity of the piezoresistive elements depends upon the defection of flexible membrane 1008. As still another alternative, membrane 1008 is the gate of a MOGFET.

Figure 11:
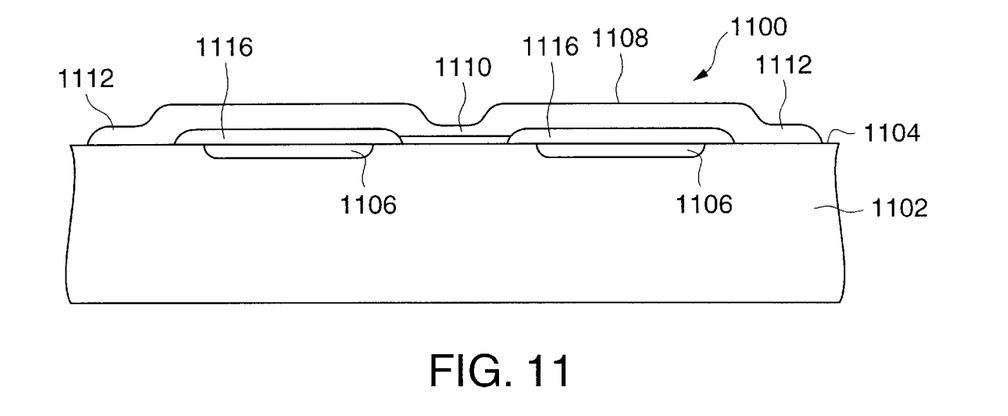
FIG. 11 is a cross-sectional side view of a capacitive sensor having a monocrystalline or polycrystalline silicon flexible diaphragm with depressions formed in the flexible diaphragm.

FIG. 11 shows a cross-sectional view of a sensor 1100 in accordance with another embodiment of the invention. Sensor 1100 includes a deposited flexible structure and is made up of a semiconductor substrate 1102 having a flat surface 1104 with active regions 1106 formed therein. Active regions 1106 are regions of high conductivity formed as described above and are connected to external circuitry. Flexible membrane 1108 deposited on surface 1104 and a "sacrificial" region (not shown) formed over active regions 1106. Removing the sacrificial region from under flexible membrane 1108 creates a cavity 1116. The sacrificial region has an annular shape so that membrane 1108 includes a pedestal 1110 and a surrounding elevated region 1112. (The view in FIG. 1 shows pedestal 1110 and elevated region 1112 in an "upside-down" orientation.) Sensor 1100 can be a capacitive sensor with active regions 1106 as one plate of the capacitor. In this case, flexible membrane 1108 makes up the other plate of the capacitor. Sensor can alternatively be a piezoresistive sensor with the piezoresistive element being formed in or on flexible membrane 1108 or a MOGFET with flexible membrane 1108 as a gate.

Figure 12:
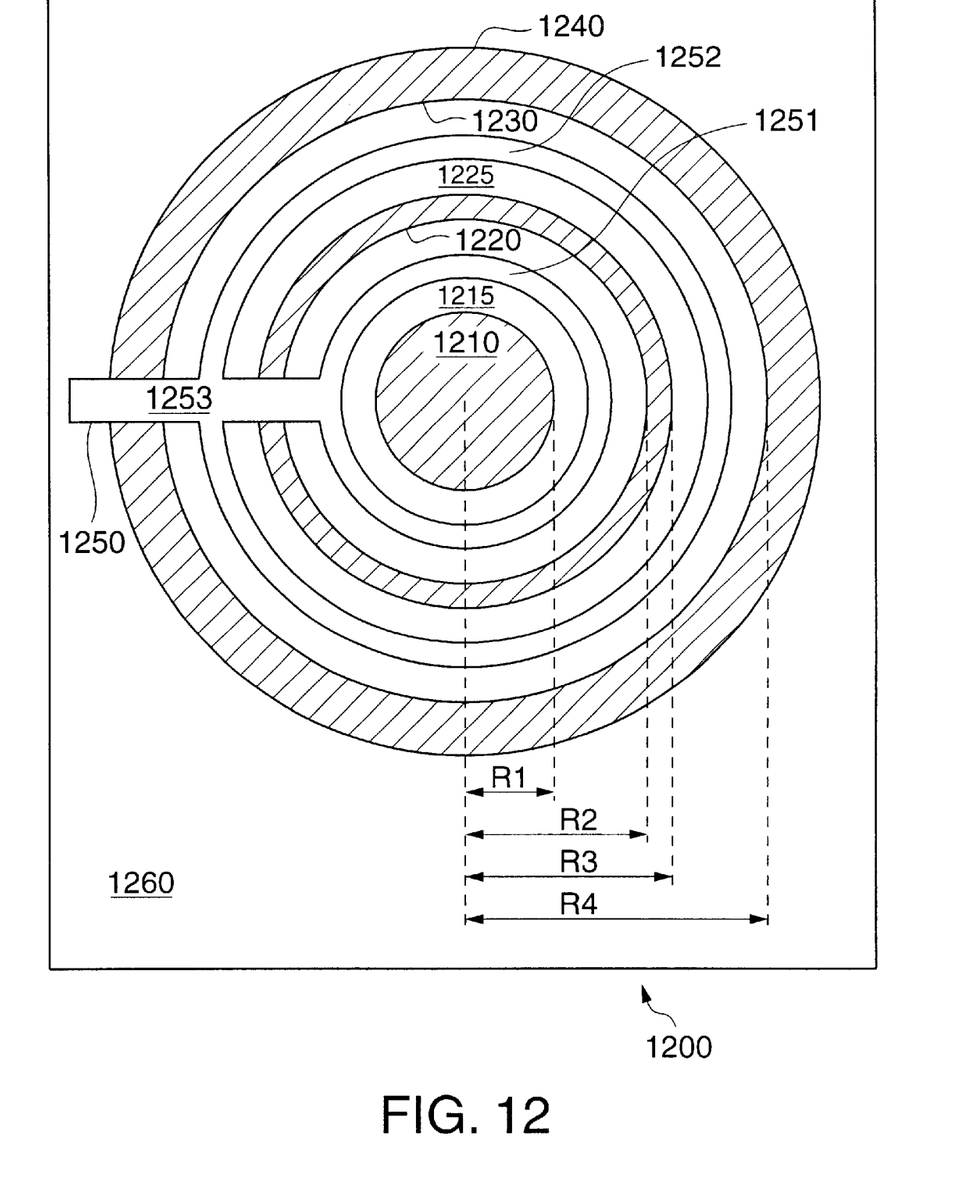
FIG. 12 is a top view of a capacitive sensor having multiple pedestals in accordance with another embodiment of the invention.

FIG. 12 shows a plan view of a MOPCAP 1200 formed in and on a substrate 1260 including two pedestals 1210 and 1220 and an elevated outer bonding surface 1230 that support a flexible membrane 1240. In the embodiment shown, pedestal 1210 is circular with a radius R1. Pedestal 1220 is annular with an inner radius R2 and an outer radius R3. A first depression 1215 in substrate 1260 is between pedestal 1210 and pedestal 1220, and a second depression 1225 is between pedestal 1220 and outer bounding surface 1230. Accordingly, substrate 1260 and flexible membrane 1240 form a cavity having two compartments, a first compartment being between radii RI and R2 and a second compartment being between radii R3 and R4. Flexible membrane 1240 forms the top plate of MOPCAP 1200. A diffused region 1250 in substrate 1260 forms the bottom plate of MOPCAP 1200 and has portions 1251 and 1252 in depressions 1215 and 1225, respectively. A portion 1253 of region 1250 crosses pedestal 1220 and extends beyond the boundary of flexible membrane 1240 for connection to external circuitry (not shown). Having multiple (two) cavities, each of which has a span selected according to the maximum sensed pressure or force and the maximum permitted membrane deflection, increases the capacitance of sensor 1200.

Sensor 1200 can be altered in a number of ways. For example, hollowing pedestal 1210 to create another compartment of the cavity or adding additional annular pedestals that create further compartments, each compartment having a span within the tolerance permitted by the maximum sensed force and maximum permitted deflection, increases the usable area of flexible membrane 1240. Additionally, pedestals 1210 and 1220 can have shapes other than circular or annular. Any desired shape can be used. Further, the multiple compartments that form a cavity are connected rather than sealed from each other. For example, a depression passing through pedestal 1220 and containing portion 1253 of diffused region 1250 can connect depressions 1215 and 1225. The multicompartment structure of sensor 1200 can also be used in a piezoresistive sensor or a MOGFET.

Figure 13A:
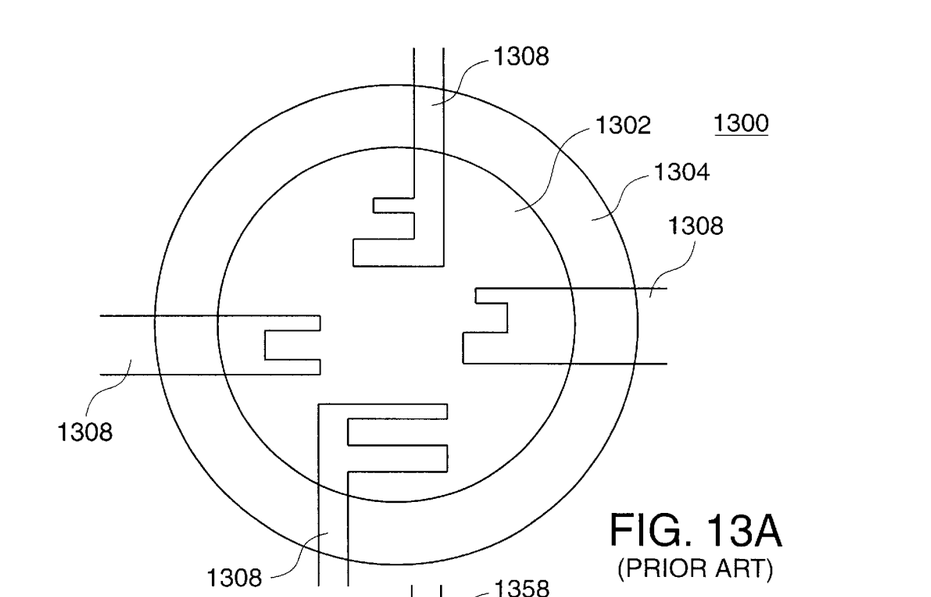
FIG. 13A is a top view of a prior art piezoresistive sensor.

FIG. 13A shows a prior art piezoresistive semiconductor device 1300 having a cavity 1302, a bonding ring region 1304, and four piezoresistive elements 1308 form on a flexible membrane bonded to region 1304. The area of cavity 1302 is restricted because the elastic modulus of the material from which the flexible membrane is made can only support a limited span at the maximum applied pressure. If the span is too long, the maximum pressure can cause the flexible membrane to contact the bottom surface of cavity 1302 or can exceed the elastic limit of the flexible membrane causing the flexible membrane to rupture or permanently deform.

Figure 13B:
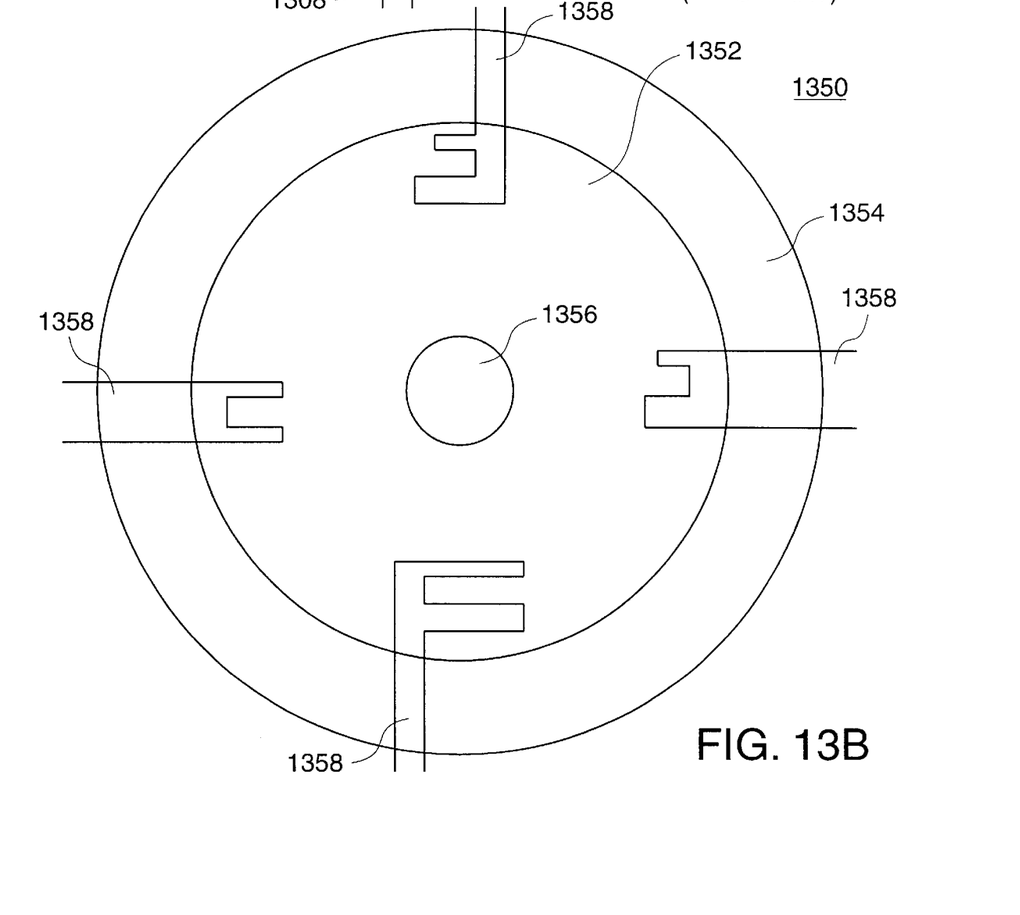
FIG. 13B is a top view of a piezoresistive sensor in accordance with the invention.

FIG. 13B shows a piezoresistive semiconductor device 1350 having four piezoresistive elements 1358 disposed on a flexible membrane that is over a cavity 1352 and bounded to a bonding region 1354 and a pedestal 1356. As described above, bonding region 1354 and pedestal 1356 can vary in shape and size and therefore vary the size and shape of cavity 1352. Pedestal 1356 is disposed generally in the center of cavity 1352 and allows the cavity 1352 to be substantially larger by reducing the maximum span required for a large area diaphragm. The larger area allows piezoresistive elements 1358 to be spaced more advantageously for measurement sensitivity and matching for temperature compensation.

Figure 14A:
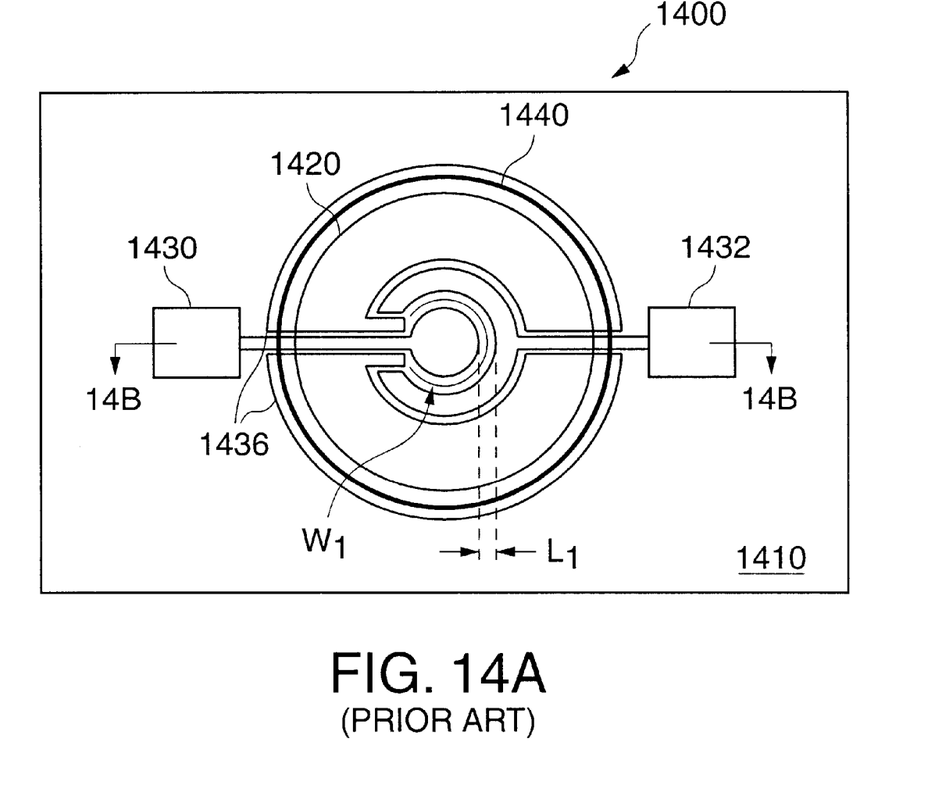
FIGS. 14A and 14B are respectively a cross-sectional side view and a plan view of a prior art moving gate transistor/sensor.
Figure 14B:
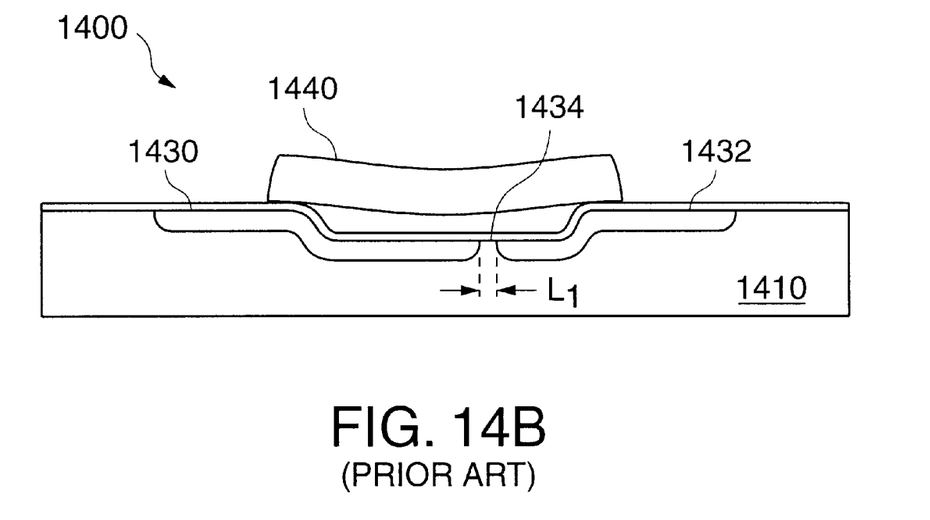

FIGS. 14A and 14B respectively show plan and side views of a MOGFET 1400 formed in and on a substrate 1410. MOGFET 1400 includes source/drain regions 1430 and 1432 that extend into a circular depression 1420 in substrate 1410. A channel region 1434 of MOGFET 1400 is in depression 1420 between source/drain region 1430 and source/drain region 1432. Also in depression 1420 are diffused guard regions 1436 that surround source/drain regions 1430 and 1432 and channel region 1434. A flexible structure 1440 is bonded to substrate 1410 overlying depression 1420 to form the gate of MOGFET 1400.

Equation 3 indicates the relationship of the source-to-drain current Ids in a field effect transistor such as MOGFET 1400 as a function of the structural parameters of the transistor and the applied voltage.

$$Ids = \mu C \frac{W}{2L}(Vgs - Vt)^2 \quad \text{Equation 3}$$

In Equation 3, $\mu$ is the carrier mobility in the channel, C is the capacitance per unit area between the gate and the channel, W is the channel width, L is the channel length, Vgs is the voltage difference between the gate and the source, and Vt is the threshold voltage of the transistor. In a sensor, measuring source-to-drain current Ids of a MOGFET can detect changes in capacitance C or threshold voltage Vt caused by movement of the flexible gate. In accordance with Equation 3, the change in source-to-drain Ids current is proportional to the channel width W of the MOGFET. Accordingly, increasing channel width W improves sensor sensitivity if all other quantities in Equation 3 are held constant.

In transistor 1400, channel 1434 is a nearly complete annular region and has a channel length L1 dependent on the distance between source/drain regions 1430 and 1432 and a channel width W1 about equal to the circumference of a circle within depression 1420. Channel length L1 has a minimum that depends on the smallest achievable feature size of the fabrication process for MOGFET 1400. Channel width W1 is constrained by the size of depression 1420. As described above, for a particular membrane material and thickness, the maximum radius of depression 1420 depends on the maximum force on flexible membrane 1440 and the maximum permitted deflection Wmax of membrane 1440. Thus, channel width W1 is similarly limited. However, maximizing channel width W1 within depression 1420 would not maximize sensor sensitivity because channel 1434 must be near the maximum deflection of flexible membrane 1440 to have the deflection cause a maximal change in capacitance C and threshold voltage Vt as in Equation 3. Accordingly, selecting a radius for channel 1432 that provides maximum sensor sensitivity requires balancing of the competing goals of maximum channel width WI for higher current Ids and proximity to the center of flexible membrane 1440 for maximum percentage change in current Ids.

Figure 15A:
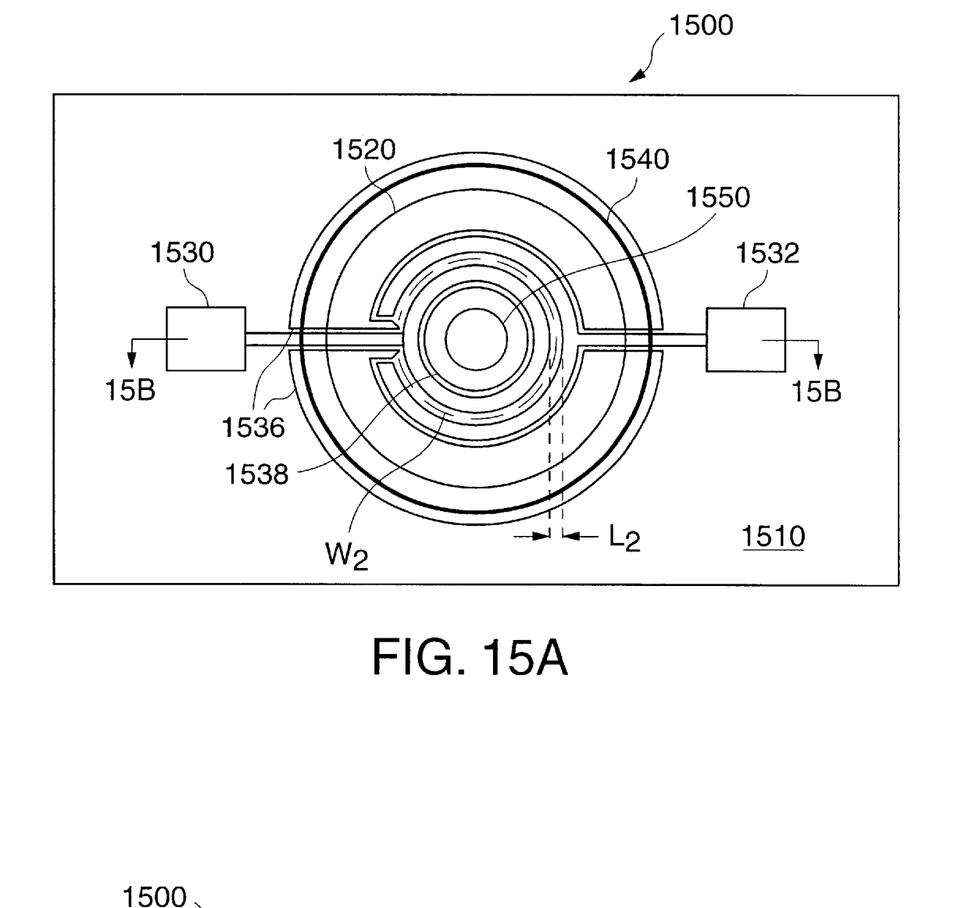
FIGS. 15A and 15B are respectively a cross-sectional side view and a plan view of a moving gate transistor/sensor in accordance with an embodiment of the invention.
Figure 15B:
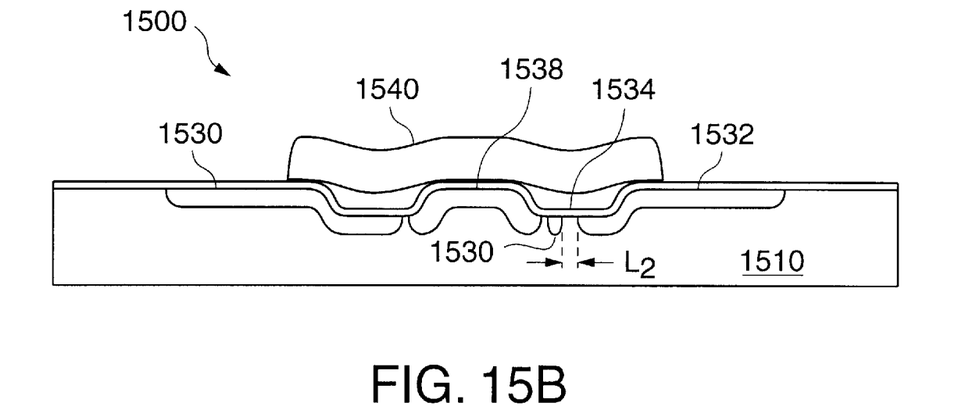

FIGS. 15A and 15B respectively show plan and side views of a MOGFET 1500 in accordance with an embodiment of the invention. MOGFET 1500 includes source/drain regions 1530 and 1532 that extend into an annular depression 1520 in a substrate 1510. The portions of source/drain regions 1530 and 1532 in depression 1520 surround a pedestal 1550 at the center of depression 1520. A channel region 1534 of channel length L2 and width W2 is in depression 1520 between source/drain region 1530 and source drain region 1532. Also in depression 1520 are diffused guard regions 1536 that surround source/drain regions 1530 an 1532. A diffused guard region 1538 is between source/drain region 1530 and pedestal 1550 and extends over pedestal 1550. A flexible structure 1540 forming the gate of MOGFET 1500 is bonded to substrate 1510 surrounding depression 1520 and at the top of pedestal 1550.

MOGFET 1500 can provide greater sensor sensitivity than can MOGFET 1400 because channel 1534 can be placed directly under the maximum deflection of flexible structure 1540 and channel width W2 can be expanded as required. In particular, channel 1534 is at a radius that is half-way between the radius Rid of pedestal 1550 and the radius Rod of depression 1520. Thus, channel 1534 is directly under the portion of membrane 1540 that deflects the most and changes capacitance C and threshold voltage Vt in MOGFET 1500 when force is applied to flexible membrane 1540. Additionally, channel width W2 can be increased to any desired dimension, provided substrate 1520 has sufficient area, because radii Rid and Rod can be expanded arbitrarily as long as the difference between radii Rid and Rod does not exceed an acceptable span for the gate material and applied force.

Although the invention has been described with reference to particular embodiments, the description is only an example of the invention's application and should not be taken as a limitation. Various adaptations and combinations of features of the embodiments disclosed are within the scope of the invention as defined by the following claims.

I claim:

1. A method of manufacturing a semiconductor device, the method comprising:

shaping a surface of a substrate to form a pedestal surrounded by a first depression, wherein the first depression is surrounded by an elevated region;

shaping the surface of the substrate to form a second depression in the top surface of the pedestal;

forming an active region in the second depression; and bonding a flexible structure to the top surfaces of the pedestal and the elevated region, wherein a cavity is disposed between the flexible structure and the first and second depression.

2. A method of manufacturing a semiconductor device, the method comprising:

shaping a surface of a substrate to form only a single pedestal surrounded by a depression, wherein the depression is surrounded by an elevated region; and bonding a flexible structure to top surfaces of the pedestal and the elevated region, wherein a cavity is disposed between the flexible structure and the depression, wherein shaping the surface of the substrate further comprises forming a second depression in the top surface of the pedestal, and further comprising forming an active region in the second depression.

3. The method of claim 2, wherein forming the active region comprises implanting dopants into the substrate before bonding the flexible structure to the substrate.

4. The method of claim 2, wherein forming the active region comprises depositing a conductive region on the substrate before bonding the flexible structure to the substrate.

5. The method of claim 2, wherein forming the active region further comprises depositing a metal layer on the substrate.

6. The method of claim 2, wherein shaping the surface of the substrate further comprises forming a plurality of concentric pedestals and concentric depressions separating the concentric pedestals from one another.

7. The method of claim 2, wherein after shaping the surface of the substrate the pedestal and the elevated region have the same height.

8. A method of manufacturing a semiconductor device, the method comprising:

shaping a surface of a substrate to form only a single pedestal surrounded by a depression, wherein the depression is surrounded by an elevated region; and bonding a flexible structure to top surfaces of the pedestal and the elevated region, wherein a cavity is disposed between the flexible structure and the depression forming an active region in a portion of the substrate, wherein after bonding the flexible structure to the substrate the active region underlies a flexible portion of the flexible structure, wherein shaping the surface of the substrate further comprises forming a second depression in the top surface of the pedestal, and the method further comprises forming a second active region in the second depression.

* * * * *